United States Patent
Lee

(10) Patent No.: US 7,157,852 B2
(45) Date of Patent: Jan. 2, 2007

(54) ORGANIC ELECTROLUMINESCENT DISPLAY DEVICE USING LOW RESISTANCE CATHODE

(75) Inventor: Kwan-Hee Lee, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 232 days.

(21) Appl. No.: 10/849,945

(22) Filed: May 21, 2004

(65) Prior Publication Data

US 2004/0245918 A1 Dec. 9, 2004

(30) Foreign Application Priority Data

Jun. 3, 2003 (KR) .................. 10-2003-0035699

(51) Int. Cl.
*H05B 33/00* (2006.01)
*H01L 51/50* (2006.01)
(52) U.S. Cl. .................. 313/506; 313/503; 428/690
(58) Field of Classification Search ................ 313/506, 313/501, 502, 503, 504, 505, 507, 508, 509, 313/510, 511, 512; 428/690
See application file for complete search history.

(56) References Cited

U.S. PATENT DOCUMENTS

| | | | |
|---|---|---|---|
| 5,714,838 A | 2/1998 | Haight et al. | ............... 313/506 |
| 5,969,474 A | 10/1999 | Arai | ............................. 313/504 |
| 6,195,034 B1 | 2/2001 | Tsuno et al. | .................... 342/1 |
| 6,366,017 B1 * | 4/2002 | Antoniadis et al. | ......... 313/506 |
| 6,469,437 B1 | 10/2002 | Parthasarathy et al. | ..... 313/504 |
| 6,548,956 B1 * | 4/2003 | Forrest et al. | .............. 313/504 |
| 2004/0081855 A1 * | 4/2004 | Kim et al. | .................. 428/690 |

FOREIGN PATENT DOCUMENTS

KR 10-2002-0000875 1/2002

* cited by examiner

*Primary Examiner*—Mariceli Santiago
*Assistant Examiner*—Anne M. Hines
(74) *Attorney, Agent, or Firm*—H.C. Park & Associates, PLC

(57) ABSTRACT

A front emitting or a dual-side emitting organic electroluminescent display device which has uniform luminance. The organic electroluminescent display device includes a substrate on which a first electrode for defining at least a portion of a pixel region is formed. An organic film layer including an emitting layer is formed on the substrate, and a second electrode including a first semi-transmissive type metal layer is formed on the organic film layer. A first transmissive type conductive oxide layer is formed on the first semi-transmissive type metal layer. A second semi-transmissive type metal layer is formed on the first transmissive type conductive oxide layer, and the second transmissive type conductive oxide layer is formed on the second semi-transmissive type metal layer.

17 Claims, 2 Drawing Sheets

ORGANIC ELECTROLUMINESCENT DISPLAY DEVICE USING LOW RESISTANCE CATHODE

CROSS REFERENCE

This application claims the benefit of Korean Patent Application No. 2003-35699, filed on Jun. 3, 2003, the disclosure of which is hereby incorporated herein by reference in its entirety.

BACKGROUND OF THE INVENTION

1. Field of the Invention

The invention relates to an organic electroluminescent display device, more particularly, to a front emitting and dual side emitting type organic electroluminescent display device having a low resistance cathode on a first transmissive type cathode to lower area resistance and to protect the first semi-transmissive type metal layer.

2. Description of Related Art

Generally, organic electroluminescent display devices adopt a rear emitting structure in which a transparent anode electrode, for example, an ITO layer, etc. is applied as a lower electrode, an organic film is formed as a multilayer structure, and a reflective cathode electrode, for example, Al, LiF/Al, LiF/Al, Li/Al, etc. is used as an upper electrode.

In the rear emitting structure, the cathode electrode of the device is an electrode for injecting electrons and it functions as a reflection film. The light from the organic electroluminescent emitting layer is transmitted towards the glass substrate (Applied Physics letter, Vol. 51,913 (1987)).

FIG. 1 is a cross sectional view of a conventional organic electroluminescent display device. The device comprises a glass substrate 10 and a transmissive type electrode or anode electrode 12, such as, an ITO layer or an electrode which functions similarly to the ITO layer. A thin film which functions as a hole injection layer 14 is formed on the anode electrode. A hole transport layer (not shown) may also be formed on the hole injection layer 14. Emitting layer 16 comprising a host doped with a dopant is formed on the hole transport layer. Cathode electrode 18 comprises of materials for easily injecting electrons, such as, Mg(Ag), LiF(Al), Li and Al.

The organic electroluminescent display device has a high luminance of about 100 to 10,000 cd/m$^2$ at a low voltage of about 0 to 10 V.

Furthermore, a front emitting structure in which electrons are injected by minimizing the thickness of a semi-transmissive type cathode electrode to 10 nm or less, and emitted light is transmitted to both sides by a coating protection layer on the transparent electrode is known (SID 96 DIGEST. 185 42.2: Novel transparent organic electroluminescent devices, G, Gu, V. B. Bulovic, P. E. Burrows, S. R. Forrest, M. E. Tomson). The cathode electrode of the device adopts a structure in which an ITO layer is formed on an Mg—Ag layer having a thickness of 100 nm.

Furthermore, in U.S. Pat. No. 5,969,474, a structure in which a IZO (zinc doped indium oxide) layer is formed on a metal having a work function of 4 eV to obtain a low resistance cathode electrode is disclosed.

Further, a structure in which an organic electroluminescent display device is formed on an opaque substrate such as Si is disclosed in U.S. Pat. No. 5,714,838. This patent discloses the use of ITO and Al as a lower layer, and a transparent material such as ZnS, GaN, ITO and ZnSe for the cathode electrode.

A front-emitting structure in which a metal is used as a reflection film anode electrode, and a transmissive type electrode is used as the cathode electrode is known (SID 2001; 384 24.4L: A 13.0-inch display with top emitting structure and adaptive current mode programmed pixel circuit; Tatsuya sasaoka, et al).

However, the front-emitting structure has defects in area resistance since a metal is used as a single reflection film anode electrode, a semi-transmissive type metal of Mg(Ag) is thinly covered as a transmissive type cathode electrode, and a conductive oxide film is introduced onto the thin semi-transmission type metal of Mg(Ag). The conductive oxide film provides resistance and serves as a protection layer for the semi-transmissive film.

FIG. 2 is a cross sectional view illustrating structure of a conventional dual side emitting type organic electroluminescent display device.

Referring to FIG. 2, the conventional organic electroluminescent display device comprises a reflection film anode electrode 22, a layer 14 for injecting or transporting holes, an emitting layer 16, a semi-transmissive type conductive cathode electrode 18 and a transmissive type electrode layer 20.

Furthermore, cathode electrode technology for substantially increasing transmittance using organic materials without the use of a metal film for easily injecting electrons is patented for a front emitting or a dual side emitting structure as disclosed in U.S. Pat. No. 6,469,437.

However, although such a front emitting or dual side emitting structure functions to increase transmittance, the structure has defects in that driving voltage is increased since electron injection is radically deteriorated compared to a structure using metallic cathode electrodes.

The thickness of ITO is limited to about 1,200 Å due to cracks in a structure of Mg—Ag or ITO currently being studied as part of a transparent cathode electrode. The area resistance is measured to be about 35 Ω/m$^2$ or less (Journal of Applied Physics Vol. 87 p 3080: Semitransparent cathode for organic light emitting devices). The power consumption tends to increase by driving voltage difference of about 2 V or more caused by area resistance in the resistance.

A ITO-Ag-ITO structure was introduced to construct a radio-wave absorbing panel in U.S. Pat. No. 6,195,034. Cases involving the study of the multilayer film including Ag as a transmissive type cathode electrode of an organic electroluminescent display device is not known, although a multilayer film including Ag has been studied in various other fields (Thin Solid Films 341 (1999) 152–155)(J. Szczyrbowski, A. Dietrich, K. Hartig, Solar Energy Mater. 19(1989) 43).

These conventional technologies have limits in lowering the area resistance of the transmissive type cathode electrode of a front emitting device. Therefore, it is very difficult to construct a large sized device. Since devices according to the conventional technologies tend to have the film peel off and to form cracks when the thickness of conductive transmission type oxide film is 150 nm or more, it is disadvantageous to form conductive oxide film of ITO using sputtering at an ordinary temperature. Furthermore, devices according to the conventional technologies are disadvantages because the film cannot be made thicker in order to lower area resistance accordingly.

SUMMARY OF THE INVENTION

This invention provides a front emitting structure or dual side emitting structure in which area resistance of the transmissive type cathode electrode is substantially lowered by introducing two transmissive type conductive oxide films onto a semi-transmission type metallic cathode electrode and introducing a metallic material having high conductivity between the oxide films.

The invention separately provides a large sized front emitting or both sides emitting type device by adopting a low resistance cathode electrode.

In order to achieve the foregoing objects, the invention provides an organic electroluminescent display device comprising a substrate on which first electrode for defining pixel region is formed; an organic film layer comprising an emitting layer formed on the substrate; and second electrode comprising first semi-transmission type metal layer formed on the front surface of the organic film layer, first transmission type conductive oxide layer laid up on the front surface of the first semi-transmission type metal layer, second semi-transmission type metal layer laid up on the front surface of the first transmission type conductive oxide layer, and second transmission type conductive oxide layer laid up on the front surface of the second semi-transmission type metal layer.

BRIEF DESCRIPTION OF THE DRAWINGS

The above and other features and advantages of the invention will become more apparent to those of ordinary skill in the art by describing in detail exemplary embodiments thereof with reference to the attached drawings.

DETAILED DESCRIPTION OF THE INVENTION

Figure 1:
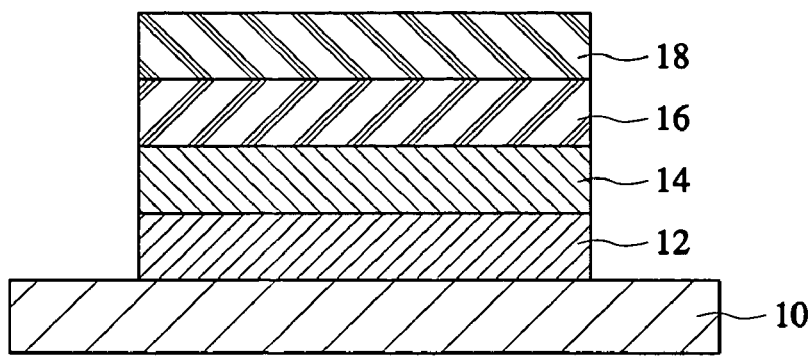
FIG. 1 is a cross sectional view illustrating the structure of a conventional organic electroluminescent display device.
Figure 2:
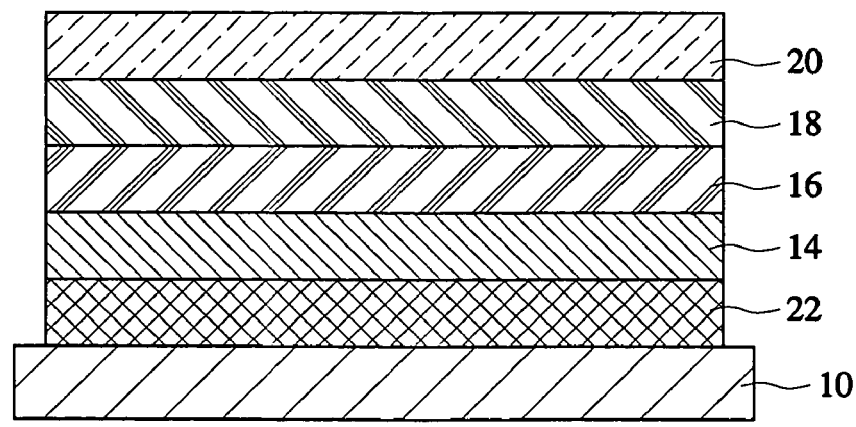
FIG. 2 is a cross sectional view illustrating the structure of a conventional dual side emitting type organic electroluminescent display device.

The invention will now be described in detail in connection with exemplary embodiments with reference to the accompanying drawings. For reference, like reference characters designate corresponding parts throughout the drawings.

Figure 3:
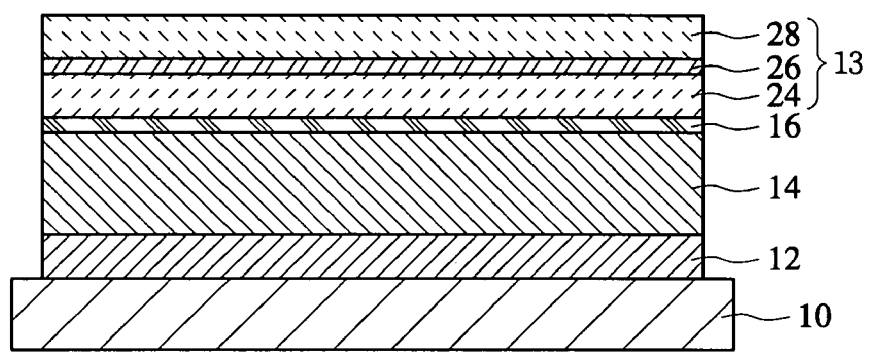
FIG. 3 is a cross sectional view illustrating a front emitting type organic electroluminescent display device according to one exemplary embodiment of the invention.
Figure 4:
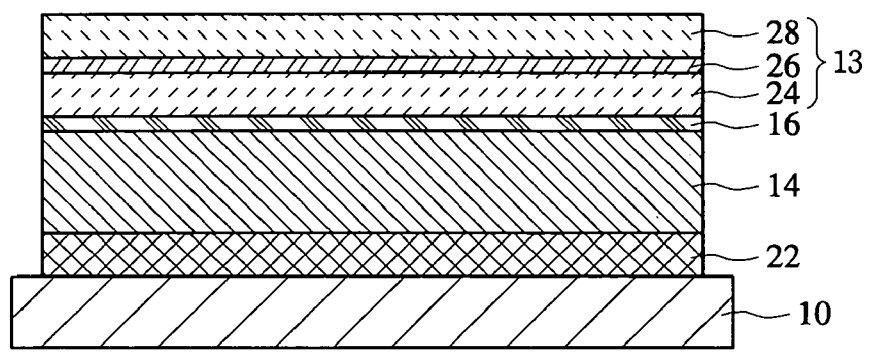
FIG. 4 is a cross sectional view illustrating a both sides emitting type organic electroluminescent display device according to another exemplary embodiment of the invention.

FIG. 3 is a cross sectional view illustrating a front emitting type organic electroluminescent display device according to one exemplary embodiment of the invention. FIG. 4 is a cross sectional view illustrating a dual side emitting type organic electroluminescent display device according to another exemplary embodiment of the invention.

An organic electroluminescent display device of the invention is constructed as illustrated in FIG. 3 such that light from the emitting layer of the organic electroluminescent display device is transmitted upward, or such that light is transmitted to both sides, as illustrated in FIG. 4.

That is, an organic electroluminescent display device according to the invention has, for example, a triple layer anode electrode with a conductive layer, a reflection film and a conduction layer, or, for example, a double reflection film anode electrode with a transmissive type or reflective type electrode used as the anode electrode. As such, a conductive metal or alloy layer, for easy hole injection, is introduced to the lower side of emitting layer, and a metal layer having good reflectivity which serves as a reflection film is introduced below the conductive metal.

Furthermore, an organic electroluminescent display device according to an exemplary embodiment of the invention has a structure in which a conductive metal of a semi-transmissive type alkali or alkaline earth metal is introduced to the upper part of the emitting layer, as the cathode electrode of the upper layer. The conductive metal allows for easy electron injection. A transparent electrode is also introduced to reduce the area resistance of the cathode electrode and to serve as a protection layer.

The invention has merits in that a large sized front-emitting or dual-side emitting organic electroluminescent display device is realized by introducing a semi-transmissive type metal, for easy electron injection, as an upper film cathode electrode of the front-emitting type or dual side emitting type organic electroluminescent display device. The metal layer between two conductive oxide films increases stability and reduces the area resistance of the metal layer, thereby substantially increasing conductivity.

Referring to FIG. 3, first electrode 12 is provided on a substrate 10 in a front-emitting exemplary structure of the invention. The substrate 10 is formed of soda lime glass or the glass as well as other proper material, and a reflective metal is used as the first electrode so that light is emitted to the front side, wherein the reflective metal comprises a single film, double or triple electrode comprising Ni, Au, Pd, Cr and/or Ag.

On the other hand, referring to FIG. 4, a dual side emitting structure capable of front and rear emission can be formed by using transmissive type metal 22 in the dual side emitting structure.

An oxide, such as, for example, ITO, IZO, ICO or ZnO can be used as the transmissive type conductive oxide.

An organic emitting layer 14 is provided on the front surface of the first electrode 12 or 22 after pattering. A second electrode 13 is deposited on the organic emitting layer, Between the first electrode 12 or 22 and the second electrode 13, a hole injection layer and/or hole transport layer, electron injection layer and/or electron transport layer (not shown) may be provided. Known high molecular emitting material as well as low molecular emitting material may be used, for example, as an emitting material for the organic emitting layer 16. Known organic materials may be used for the hole injection layer, hole transport layer, electron injection layer and/or electron transport layer.

The thickness of each layer is generally about 10 nm to about 100 nm, and the optimum thickness of each layer is selected according to a vacuum heat deposition method.

An organic emitting material may comprise a fluorescent material capable of emitting light. For example, a metal complex, such as, tris(8-aminolinolato)aluminum may be used as electron transport layer. Furthermore, tetraarylbenzidine series materials may be used for a hole transport layer or a hole injection layer. For example, various materials including TPD (triaryldiamine or tetraphenyldiamine) or aromatic tertiary amine may be used for the hole transport layer or the hole injection layer. Other suitable organic materials may be used for the emitting layer may.

The second electrode 13 is generally provided on the upper part of the emitting layer after the organic emitting layer 16 has been formed. The second electrode 13 of the invention comprises a first transmissive type conductive oxide layer 24, a second transmissve type conductive oxide layer 28, and a second semi-transmissive type metal layer 26. The first transmissive type conductive oxide layer may be provided on the front surface of a first semi-transmissive type metal layer, the second semi-transmissive type metal layer may be provided on the front surface of the first transmissive type conductive oxide layer, and the second transmission type conductive oxide layer may be provided on the front surface of the second semi-transmissive type metal layer. Such a structure provides increased conductivity and lower area resistance.

The first semi-transmissive type metal may be a metal having a small work function for easy electron injection and the first semi-transmissive type metal is generally laid up to a thickness of about 40 nm or less using Ca, Mg—Ag, LiF/Al, Li/Al, Li and/or Al.

The first transmissive type conductive oxide layer, second semi-transmissive type metal and second transmissive type conductive oxide layer are continuously provided on the first semi-transmissive type metal layer.

A conductive oxide film having high transmittance may be used as the first transmissive type conductive oxide layer and the second transmissive type conductive oxide layer. Oxides including indium tin oxide (ITO), indium zinc oxide (IZO), indium cerium oxide (ICO) and zinc oxide (ZnO) may be used as a material with a high transmittance. ITO is generally used as the first transmissive type conductive oxide layer and second transmissive type conductive oxide layer.

The same or different material can be used as the first transmissive type conductive oxide layer and second transmissive type conductive oxide layer. The first transmissive type conductive oxide layer and the second transmissive type conductive oxide layer are generally independently laid up to a thickness of about 10 nm to about 100 nm. Generally, it is not desirable for the first transmissive type conductive oxide layer and second transmissive type conductive oxide layer to be laid up to a thickness of 10 nm or less because conductivity is not good. If transmittance is not an important issue, the first transmissive type conductive oxide layer and second transmissive type conductive oxide layer may be laid up to a thickness of about 100 nm or more. Generally, the first transmissive type conductive oxide layer and the second transmissive type conductive oxide layer are laid up to a thickness of about 100 nm or less since transmittance matters if the first transmissive type conductive oxide layer and second transmissive type conductive oxide layer are laid up to a thickness of about 100 nm or more.

A thin metal film material having high conductivity such as Al, Cu, Ag, Pt, Au, Ir or Pd may be used as the second semi-transmissive type metal between the first transmissive type conductive oxide layer and the second transmissive type conductive oxide layer to increase conductivity of the transmissive film. Generally, Ag is used as the second semi-transmissive type metal. The second semi-transmissive type metal is generally in the thickness range of about 5 nm to about 30 nm and, more particularly, in the thickness range of about 5 nm to about 20 nm. Generally, the thickness of the second transmissive type conductive oxide layer depends on the effect the thickness has on stability, reflectivity and transmittance of the second semi-transmissive type metal. ransmittance is reduced as thickness of the second semi-transmissive type metal is being increased.

The first and second transmissive type oxide films and second semi-transmissive type metal layer are formed by thermal deposition using sputtering.

In various embodiments of the invention, a transmissive type cathode film having high transmittance and very low area resistance is continuously formed inside organic material deposition equipment.

A protection layer (not shown) which is capable of preventing deterioration of device by blocking infiltration of moisture or $O_2$ gas from the outside and capable of protecting the organic material layer inside device may be provided on the transmissive type cathode film layer using sputtering or e-beam evaporation techniques after formation of the transmissive type cathode film layer.

The protection layer may be formed as a single layer or as a multilayer. The protection layer may, for example, be made of $Y_2O_3$, $SiO_2$, SiNx, SiNxOy, an organic layer and/or an inorganic layer capable of playing a role thereof. The inorganic protection layer is deposited on the transmissive type cathode film layer using, for example, sputtering or e-beam evaporation technologies.

A device is generally completed by subjected the device to a sealing process which seals the deposited protection layer with the glass after the protection layer (not shown) is deposited. The sealing process is performed to prevent infiltration of moisture or oxygen into the device using, for example, photo-hardening adhesive, epoxy adhesive, silicone adhesive, double polymer adhesive, or other suitable adhesives. The final sealing process is performed using glass as well as transparent plastic.

The invention is not restricted to an organic electroluminescent display device having structures exemplified in FIG. 3 and FIG. 4, and can include an organic electroluminescent display device having various other appropriate structures. Furthermore, the invention is not restricted to the organic electroluminescent display device, but can be applied to active organic electroluminescent display devices or passive organic electroluminescent display devices having two or more transistors.

A front-emitting type or dual-side emitting type organic electroluminescent display device of the invention has merits in that luminance uniformity is provided for large sized front-emitting type or dual-sides emitting type devices, and a device of low power consumption can be formed by maintaining efficiency and substantially lowering area resistance.

Exemplary embodiments of the invention are suggested as follows. The following Examples are suggested to further describe features of the invention and it should be understood that the invention is not restricted to the following Examples.

EXAMPLE 1

An ITO or Ag alloy deposition film of cathode electrode was formed in a structure of ITO(40 nm)/Ag(15 nm)/ITO(40 nm) through a DC magnetron sputtering system. DC power was impressed onto two cathode electrodes, and multilayer film was continuously deposited on soda lime glass under the vacuum state. An ITO target having 99.99% of purity and containing 10 wt. % of $SnO_2$ was deposited at an ordinary temperature using a target of 4 inches. The other substrate, the anode electrode and the organic emitting layer were deposited in an ordinary manner. Area resistance of Ag was 5 $\Omega/cm^2$, and transmittance of the Ag in the 520 nm light wavelength was 87% based on the measuring results of the metal target. Transmittances in the visible ray range of low resistance three-layer film are represented in the following Table 1. A transmissive type cathode was deposited on an organic electroluminescent display device based on the test results of the unit films.

EXAMPLE 2

An organic electroluminescent display device was fabricated in the same process as in the Example 1 except that IZO was used instead of ITO of the Example 1. Measured results of transmittance and area resistance were represented in the following Table 1.

COMAPARATIVE EXAMPLE 1

An organic electroluminescent display device was fabricated in the same process as in the Example 1 except that the cathode electrode was formed of ITO having thickness of 80 nm instead of the three-layer structure of ITO/Ag/ITO in the Example 1. Measured results of the transmittance and area resistance are represented in the following Table 1.

TABLE 1

|  | Transmittance (520 nm) | Area resistance ($\Omega/cm^2$) |
|---|---|---|
| EXAMPLE 1(ITO(40)/Ag(15)/ITO(40)) | 87% | 5 |
| EXAMPLE 2(IZO(40)/Ag(15)/IZO(40)) | 85% | 5 |
| COMPARATIVE EXAMPLE 1 (ITO(80)) | about 90% | 70 |

As represented in Table 1, it can be seen that there is no loss of transmittance, and area resistance of Examples 1 and 2 is decreased down to a level which is almost 1/10 of the area resistance of the Comparative Example. As discussed above, Examples 1 and 2 show the experimental results for organic electroluminescent display devices according to the invention comprising a subsidiary cathode electrode having a three-layer structure.

EXAMPLE 3

A 2×2 mm emitting region of 2×2 was patterned with an organic insulation film is after a reflective anode electrode formed of aluminum/ITO was provided on a substrate. The material was treated using $UV/O_3$ after sequentially cleaning the resulting material using water, isopropyl alcohol and acetone. A hole injection layer having a thickness of 25 nm was formed by vacuum depositing CuPc. The CuPc layer was used as a common layer of the hole injection layer on the treated material, and the hole transport layer was formed on the treated material by vacuum depositing NPB.

A blue emitting layer having a thickness of 15 mm was formed by thermal depositing a mixture of a blue host and a blue dopant mixed in a ratio of 100:4 on the upper surface of the hole transport layer.

A hole inhibition layer having thickness of 5 nm was formed by depositing Balq on the upper part of the emitting layer, an electron transport layer having thickness of 25 nm was formed by vacuum depositing Alq3 on the upper part of the hole inhibition layer, and an electron injection layer having a thickness of 3 nm was formed by vacuum depositing LiF on the upper part of the electron transport layer.

A cathode electrode was formed to a thickness of 10 nm by simultaneously thermal depositing a mixture of magnesium and silver mixed in a ratio of 10:1 on the upper part of the electron transport layer. Next, Ag was deposited to a thickness of 5 nm on the ITO using sputtering after forming ITO to a thickness of 40 nm on the upper part of the cathode electrode, and then ITO was formed to a thickness of 40 nm on the upper part of Ag.

A front emitting type organic electroluminescent display device was completed by heat hardening treating the sealed material at a temperature of 70° C. for one hour after sealing the resulting material using UV adhesive under the nitrogen gas environment and non-water conditions.

EXAMPLES 4–5

An organic electroluminescent display device was fabricated in the same process as in the Example 1 except that Ag in the Example 1 was deposited to a deposition thickness of 10 nm and 20 nm.

COMPARATIVE EXAMPLE 2

An organic electroluminescent display device was fabricated in the same process as in the Example 3 except that the cathode electrode in the Example 3 was formed of ITO having thickness of 80 nm instead of three-layer structure of ITO/Ag/ITO.

The measured characteristics are represented in Table 2 by measuring characteristics of organic electroluminescent display devices of the Examples 3–5 and Comparative Example 2.

TABLE 2

|  | Transmittance (520 nm) | Area resistance ($\Omega/m^2$) | Color coordinates |
|---|---|---|---|
| EXAMPLE 3 (ITO(40)/Ag(5)/ITO(40)) | 75% | 20 | (0.14, 0.13) |
| EXAMPLE 4 (ITO(40)/Ag(10)/ITO(40)) | 60% | 5 | (0.14, 0.10) |
| EXAMPLE 5 (ITO(40)/Ag(20)/ITO(40)) | 40% | 2 | (0.14, 0.16) |
| COMPARATIVE EXAMPLE 2 (ITO(80)) | 80% | 45 | (0.14, 0.14) |

As represented in Table 2, the effect of reducing the area resistance is certainly shown although transmittance is reduced compared to the Comparative Example 2 as thickness of Ag is being increased, as in the Examples 3–5. Furthermore, it can be seen that color coordinates are also improved in the case where the thickness of Ag is 10 nm. Furthermore, it is expected that the improving effect of area resistance and color coordinates according to lowering of transmittance is not that great as thickness of Ag is being increased. It is expected that introducing Ag of a certain thickness into a full color organic electroluminescent display device, thereby substantially improving area resistance of the device, does not increase driving voltage.

A cathode having substantially lower area resistance while substantially maintaining its light transmissive characteristics is formed using a conductive oxide/metal/conductive oxide structure in an organic electroluminescent display device of the invention so that the cathode can be used for both front emission and dual-side emission. The cathode can be applied to large sized front and dual-sides type devices. Furthermore, the cathode is easily applied to the processes using sputtering technology, and power consumption is substantially improved and luminance non-uniformity disappears as IR drop is being improved in case that the cathode is applied to a large sized device.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. An organic electroluminescent display device comprising:
    a substrate on which a first electrode for defining at least a portion of a pixel region is formed;
    an organic film layer comprising at least an emitting layer formed on the substrate; and
    a second electrode comprising:
    a first semi-transmissive type metal layer formed on the organic film layer;
    a first transmissive type conductive oxide layer on the first semi-transmissive type metal layer,
    a second semi-transmissive type metal layer on the first transmissive type conductive oxide layer, and
    a second transmissive type conductive oxide layer on the second semi-transmissive type metal layer.

2. The organic electroluminescent display device of claim 1, wherein the first electrode is an anode electrode, and the second electrode is a cathode electrode.

3. The organic electroluminescent display device of claim 1, wherein the first semi-transmissive type metal layer comprises a material selected from the group consisting of Mg—Ag, LiF—Al, Li and Al.

4. The organic electroluminescent display device of claim 1, wherein the first transmissive type conductive oxide layer and the second transmissive type conductive oxide layer comprise a material selected from the group consisting of ITO, IZO, ICO and ZnO and the first transmissive type conductive oxide layer and the second transmissive type conductive oxide layer comprise a same material or a different material.

5. The organic electroluminescent display device of claim 1, wherein the second semi-transmissive type metal layer comprises a material selected from the group consisting of Ag, Pt, Au, Ir, Pd, Cu and Al.

6. The organic electroluminescent display device of claim 5, wherein the first transmissive type conductive oxide layer and the second transmission type conductive oxide layer comprise ITO, and the second semi-transmissive type metal layer comprises Ag.

7. The organic electroluminescent display device of claim 1, wherein the first transmissive type oxide layer and second transmissive type oxide layer each have a thickness of about 10 nm to 100 nm.

8. The organic electroluminescent display device of claim 1, wherein a thickness of the first semi-transmissive type metal layer is about 40 nm or less.

9. The organic electroluminescent display device of claim 1, wherein the second semi-transmissive type metal layer has a thickness of about 5 nm to 30 nm.

10. The organic electroluminescent display device of claim 9, wherein the second semi-transmissive type metal layer has a thickness of about 5 nm to about 20 nm.

11. The organic electroluminescent display device of claim 1, wherein the first electrode further comprises a reflection film.

12. The organic electroluminescent display device of claim 11, wherein the reflection film comprises a layer, a double layer or a triple layer of a metal selected from the group consisting of Ni, Au, Pd, Cr and Ag.

13. The organic electroluminescent display device of claim 1, wherein the first electrode comprises a transparent conductive oxide selected from the group consisting of ITO, IZO, ICO and ZnO.

14. The organic electroluminescent display device of claim 1, wherein the first transmissive type conductive oxide layer, the second semi-transmissive type metal layer and the second transmissive type conductive oxide layer are formed by a sputtering method.

15. The organic electroluminescent display device of claim 1, wherein the organic electroluminescent display device further comprises a protection film layer on the upper part of the second electrode.

16. The organic electroluminescent display device of claim 1, wherein the first transmissive type conductive oxide layer is provided on a front-side facing surface of the first semi-transmissive type metal layer, the second semi-transmissive type metal layer is provided on a front-side facing surface of the first transmissive type conductive oxide layer, and the second transmissive type conductive oxide layer is provided on a front-side facing surface of the second semi-transmissive type metal layer.

17. The organic electroluminescent display device of claim 1, wherein the organic electroluminescent display device is a dual-side emitting organic electroluminescent display.

* * * * *